US010836961B2

(12) United States Patent
Watanabe et al.

(10) Patent No.: US 10,836,961 B2
(45) Date of Patent: Nov. 17, 2020

(54) PHOSPHOR, METHOD FOR MANUFACTURING SAME, AND LIGHT-EMITTING DEVICE

(71) Applicants: KOHA CO., LTD., Tokyo (JP); NATIONAL INSTITUTE FOR MATERIALS SCIENCE, Tsukuba (JP)

(72) Inventors: Makoto Watanabe, Tokyo (JP); Daisuke Inomata, Tokyo (JP); Kazuo Aoki, Tokyo (JP); Kiyoshi Shimamura, Tsukuba (JP); Encarnacion Antonia Garcia Villora, Tsukuba (JP)

(73) Assignees: KOHA CO., LTD., Tokyo (JP); NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 251 days.

(21) Appl. No.: 15/724,357

(22) Filed: Oct. 4, 2017

(65) Prior Publication Data

US 2018/0044588 A1 Feb. 15, 2018

Related U.S. Application Data

(63) Continuation of application No. 14/396,034, filed as application No. PCT/JP2013/061553 on Apr. 18, 2013, now abandoned.

(30) Foreign Application Priority Data

Apr. 24, 2012 (JP) ................................. 2012-099315

(51) Int. Cl.
| | |
|---|---|
| C09K 11/77 | (2006.01) |
| C30B 15/04 | (2006.01) |
| C30B 29/28 | (2006.01) |
| H01L 33/50 | (2010.01) |
| C30B 15/00 | (2006.01) |

(52) U.S. Cl.
CPC .......... *C09K 11/7774* (2013.01); *C30B 15/00* (2013.01); *C30B 15/04* (2013.01); *C30B 29/28* (2013.01); *H01L 33/501* (2013.01); *H01L 33/502* (2013.01); *H01L 33/505* (2013.01); *H01L 33/507* (2013.01); *H01L 2224/13* (2013.01); *H01L 2224/48091* (2013.01); *H01L 2224/49107* (2013.01); *H01L 2924/12044* (2013.01); *H01L 2933/0041* (2013.01)

(58) Field of Classification Search
CPC ... C09K 11/774; H01L 33/502; H01L 33/505; C30B 29/28; C30B 29/64
See application file for complete search history.

(56) References Cited

U.S. PATENT DOCUMENTS

| | | | |
|---|---|---|---|
| 6,538,371 B1 | 3/2003 | Duggal et al. | |
| 7,728,508 B2 | 6/2010 | Kondo et al. | |
| 8,339,025 B2 * | 12/2012 | Nakamura | B82Y 30/00 313/484 |
| 8,410,446 B2 | 4/2013 | Nakamura et al. | |
| 9,112,123 B2 | 8/2015 | Aoki | |
| 2005/0006659 A1 | 1/2005 | Ng et al. | |
| 2005/0276995 A1 * | 12/2005 | Kondo | C09K 11/7774 428/690 |
| 2006/0043337 A1 | 3/2006 | Sakane et al. | |
| 2009/0008663 A1 | 1/2009 | Shimizu et al. | |
| 2010/0187423 A1 | 7/2010 | Nakamura et al. | |
| 2010/0301739 A1 | 12/2010 | Nakamura et al. | |
| 2012/0069547 A1 | 3/2012 | Gielen et al. | |
| 2012/0069570 A1 | 3/2012 | Marinus et al. | |
| 2012/0126173 A1 | 5/2012 | Nass | |
| 2012/0162988 A1 | 6/2012 | Marinus et al. | |
| 2013/0207151 A1 | 8/2013 | Eberhardt et al. | |
| 2014/0043788 A1 | 2/2014 | Gielen et al. | |
| 2015/0083967 A1 | 3/2015 | Watanabe et al. | |
| 2015/0362170 A1 | 12/2015 | Marinus et al. | |

FOREIGN PATENT DOCUMENTS

| | | |
|---|---|---|
| CN | 1169587 A | 1/1998 |
| CN | 1707822 A | 12/2005 |
| CN | 1815765 A | 8/2006 |

(Continued)

OTHER PUBLICATIONS

International Search Report (ISR) (PCT Form PCT/ISA/2010), in PCT/JP2013/061553, dated Jul. 30, 2013.
English Translation of International Preliminary Report on Patentability in PCT No. PCT/JP2013/061553 dated Nov. 6, 2014.
Chinese Office Action dated Jun. 26, 2015 with a partial Enulish translation thereof.
Extended European Search Report dated Feb. 23, 2016.
Kamada, K. et al.: "Paper; Scintillator-oriented Combinatorial Search in Ce-doped (Y, Gd)$_3$ (Ga, Al) $_5$O$_{12}$ Multicomponent Garnet Compounds; Scintillator-oriented Combinatorial Search in Ce-doped (Y. Gd)$_3$ (Ga, Al) $_5$O$_{12}$ Multicomponent Garnet Compounds", Journal of Physics D: Applied Physics, Institute of Physics Publishing Ltd, GB, vol. 44, No. 5O, Dec. 2, 2011 (Dec. 2, 2011), p. 505104, XP020213979, ISSN :002-3727, DOI: 10.1088/0022-3727/44/50/505104.

(Continued)

*Primary Examiner* — C Melissa Koslow
(74) *Attorney, Agent, or Firm* — McGinn I.P. Law Group, PLLC.

(57) ABSTRACT

A phosphor-containing member includes a transparent member, and a plurality of granular single crystal phosphors dispersed in the transparent member. Each of the plurality of granular single crystal phosphors includes a YAG crystal as a mother crystal. The plurality of granular single crystal phosphors are prepared by crushing the YAG crystal. The YAG crystal has a composition represented by a formula of $Y_{3-x-y}Gd_xCe_yAl_5O_{12-w}$ ($0.03 \leq x \leq 0.2$, $0.003 \leq y \leq 0.2$, $-0.2 \leq w \leq 0.2$). Reduction of fluorescence intensity of the phosphors is less than 3% when an excitation light wavelength is 460 nm and a temperature is increased from 25° C. to 100° C.

13 Claims, 12 Drawing Sheets

(56) References Cited

FOREIGN PATENT DOCUMENTS

| | | |
|---|---|---|
| CN | 101128563 A | 2/2008 |
| CN | 102061169 A | 5/2011 |
| EP | 2 128 222 A1 | 12/2009 |
| JP | 2001-320094 A | 11/2001 |
| JP | 2003-204079 A | 7/2003 |
| JP | 2005-033211 A | 2/2005 |
| JP | 2005-353888 A | 12/2005 |
| JP | 2006-041096 A | 2/2006 |
| JP | 2006-57018 A | 3/2006 |
| JP | 2006-303373 A | 11/2006 |
| JP | 2010-155891 A | 7/2010 |
| JP | 2012-17455 A | 1/2012 |
| JP | 2012-528920 A | 11/2012 |
| JP | 5649202 B2 | 1/2015 |
| WO | WO 2008/093869 A1 | 8/2008 |
| WO | WO 2010/136116 A1 | 12/2010 |
| WO | WO 2010/136920 A1 | 12/2010 |
| WO | WO 2012/045772 A1 | 4/2012 |

OTHER PUBLICATIONS

Chinese Office Action dated Mar. 21, 2016 with en EnOsh translation thereof.

"Temperature-dependent photoluminescence studies on $Y_{2.33-x}LN_xAl_5O_{12}:Ce_{0.07}$ (Ln = Gd, La) phosphors for white LEDs application", Qiyue Shao et al., Journal of Alloys and Compounds, vol. 496, pp. 199-202.

Chinese Office Action dated Aug. 30, 2016 with an English translation thereof.

Japanese Office Action dated Oct. 18, 2016 with a partial English translation thereof.

Japanese Office Action, dated Feb. 28, 2017, in Japanese Application No. 2014-191774 and Partial English Translation thereof.

Extended European Office Action, dated Mar. 13, 2019, in European Application No. 18203753.1.

Japanese Office Action, dated Oct. 16, 2018, in Japanese Application No. 2017-202764 and a partial English Translation thereof.

Shao et al., "Temperature-dependent photoluminescence studies on $Y_{2.93-x}Ln_xAl_5O_{12}: Ce_{0.07}$ (Ln = Gd, La) phosphors for white LEDs application" Elsevier: Journal of Alloys and Compounds, 498(2):199-202, May 2010.

Chinese Office Action dated Sep. 4, 2018 in Chinese Patent Application No. 201710400618.0 with an English translation thereof.

Chinese Office Action, dated Oct. 9, 2019, in Chinese Application No. 201710400618.0 and English Translation thereof.

* cited by examiner

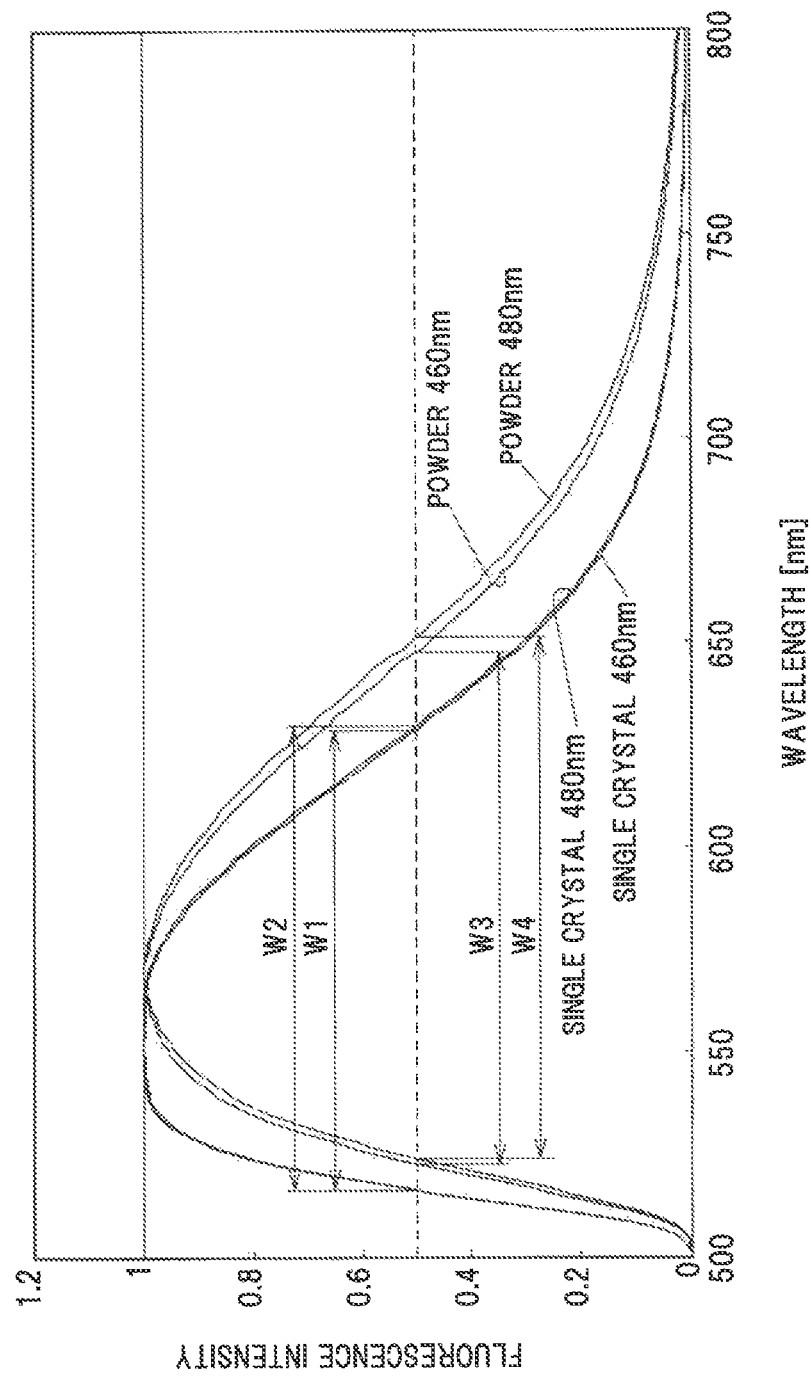

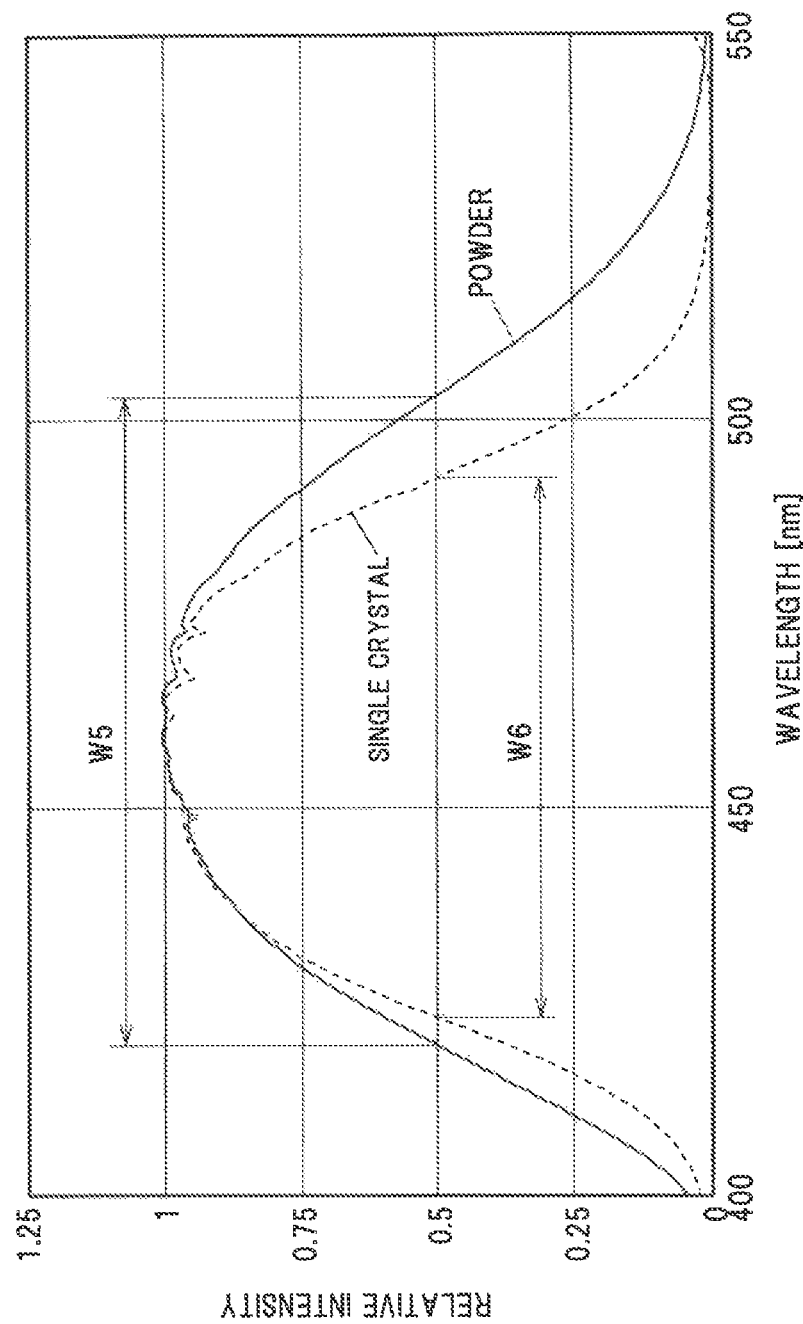

PHOSPHOR, METHOD FOR MANUFACTURING SAME, AND LIGHT-EMITTING DEVICE

The present application is a Continuation Application of U.S. patent application Ser. No. 14/396,034, filed on Oct. 21, 2014, now abandoned, which is based on International. Application No. PCT/22013/061553, filed on Apr. 18, 2013, which is based on Japanese Patent Application No. 2012-099315, filed on Apr. 24, 2012, the entire contents of which are incorporated herein by reference.

This invention relates to a phosphor, a method for manufacturing the same, and a light emitting device.

BACKGROUND ART

Conventionally, a light emitting device is known that includes a light emitting element comprised of an LED (Light Emitting Diode) configured to emit a blue light and a phosphor configured to emit a yellow light by receiving a light of the light emitting element so as to be excited, and that is configured to emit a white light by mixing of these light emission colors (for example, refer to PTL 1).

The light emitting device disclosed in PTL 1 is configured such that a granular phosphor is included in an epoxy resin to be arranged around a light emitting element configured to emit a blue light, so that a white light is emitted by mixing of an emission light of the light emitting element itself and a yellow light emitted from the phosphor.

CITATION LIST

Patent Literature

[PTL 1]
JP-2010-155891 A1

SUMMARY OF INVENTION

Technical Problem

In accordance with a light emitting device being high powered, heat generation of a light emitting element becomes a large problem. Particularly, the problem is variation in characteristics of the light emitting device, the variation being generated by that variation in light emission characteristics due to input electric power to the element, and variation in characteristics of a phosphor in accordance with temperature increase affect each other

Solution of Problem

Generally, a phosphor has an inherent quantum efficiency (a conversion efficiency from an excitation light to a fluorescent light) and temperature quenching characteristics (characteristics that the quantum efficiency is reduced in accordance with temperature increase). If the quantum efficiency is high, a light emitting device with a higher brightness using the phosphor can be obtained, and if the temperature quenching characteristics are excellent, the phosphor can be used for a light emitting device with a higher output In addition, if variation in an emission spectrum to an excitation wavelength is small, a light emitting device with a smaller characteristics variation can be fabricated.

Therefore, it is one of objects of the invention to provide a phosphor excellent in a quantum efficiency, a method for manufacturing the same, and a light emitting device using the phosphor. In addition, it is one of objects of the invention to provide a phosphor excellent in temperature quenching characteristics, a method for manufacturing the same, and a light emitting device using the phosphor. Furthermore, it is one of objects of the invention to provide a phosphor configured such that variation in an emission spectrum is small in a wider range to an excitation wavelength, a method for manufacturing the same, and a light emitting device using the phosphor.

Solution to Problem

According to one embodiment of the invention, a phosphor as defined in [1] to [5] below is provided so as to achieve the object.

[1] A phosphor, comprising:
single crystals comprising YAG crystals as a mother crystal,
wherein the quantum efficiency of the phosphor at 25° C. is not less than 92% when an excitation light wavelength is 460 nm.

[2] A phosphor, comprising:
YAG crystals as a mother crystal,
wherein reduction of fluorescence intensity of the phosphor is less than 3% when an excitation light wavelength is 460 nm and a temperature is increased from 25 to 100° C.

[3] A phosphor, comprising:
YAG crystals as a mother crystal,
wherein variation of the full width at half maximum (FWHM) of fluorescence spectrum of the phosphor is not more than 1.5 nm when the excitation light wavelength is varied from 460 to 480 nm.

[4] The phosphor according to any one of [1] to [3], further comprises a first dopant comprised of Gd or Lu and a second dopant comprised of not less than one element selected from the group consisting of Ce, Tb, Eu, Yb, Pr, Tm, and Sm.

[5] The phosphor according to any one of [1] to [3] is a single-phase phosphor.

According to another embodiment of the invention, a light emitting device as defined in [6] to [10] below is provided so as to achieve the object.

[6] A light emitting device, comprising:
a light emitting element configured to emit a blueish light; and
a phosphor configured to emit a yellowish light by using a light of the light emitting element as an excitation light,
wherein the phosphor comprises single crystals comprising YAG crystals as a mother crystal,
wherein the quantum efficiency of the phosphor at 25° C. is not less than 92% when the excitation light wavelength is 460 nm.

[7] A light emitting device, comprising:
a light emitting element configured to emit a blueish light; and
a phosphor configured to emit a yellowish light by using a light of the light emitting element as an excitation light,
wherein the phosphor comprises YAG crystals as a mother crystal,
wherein reduction of fluorescence intensity of the phosphor is less than 3% when an excitation light wavelength is 460 nm and a temperature is increased from 25 to 100° C.

[8] A light emitting device, comprising:
a light emitting element configured to emit a blueish light; and a phosphor configured to emit a yellowish light by using a light of the light emitting element as an excitation light, wherein the phosphor comprises YAG crystals as a mother crystal, wherein variation of the full width at half maximum (FWHM) of fluorescence spectrum of the phosphor is not more than 1.5 nm when the excitation light wavelength is varied from 460 to 480 nm.

[9] The light emitting device according to any one of [6] to [8], wherein the phosphor further comprises a first dopant comprised of Gd or Lu and a second dopant comprised of not less than one element selected from the group consisting of Ce, Tb, Eu, Yb, Pr, Tm, and Sm.

[10] The light emitting device according to any one of [6] to [8], wherein the phosphor further comprises a single phase phosphor.

According to another embodiment of the invention, a method for manufacturing a phosphor as defined in [11] below is provided so as to achieve the object.

[11] A method for manufacturing a phosphor by Czochralski method, the method comprising:

mixing a $CeO_2$ powder as a raw material of Ce, a $Y_2O_3$ powder as a raw material of Y, an $Al_2O_3$ powder as a raw material of Al, and a $Gd_2O_3$ powder as a raw material of Gd, so as to obtain a mixed powder, melting the mixed powder, so as to obtain a melt, and bringing a seed crystal into contact with the melt, so as to pull up a single crystal phosphor comprising YAG crystals as a mother crystal and containing Ce and Gd at a pull up speed of not more than 1 mm/h and at a pull up temperature of not less than 1960° C.

Advantageous Effects of Embodiments

According to one embodiment of the invention, a phosphor excellent in a quantum efficiency, a method for manufacturing the same, and a light emitting device using the phosphor can be provided. In addition, according to another embodiment of the invention, a phosphor excellent in temperature quenching characteristics, a method for manufacturing the same, and a light emitting device using the phosphor can be provided. Furthermore, according to another embodiment of the invention, a phosphor configured such that variation in an emission spectrum is small in a wider range to an excitation wavelength, a method for manufacturing the same, and a light emitting device using the phosphor can be provided.

BRIEF DESCRIPTION OF DRAWINGS

FIG. 2 is a graph showing a fluorescence spectrum distribution obtained by a fluorescence measurement of the phosphor according to the first embodiment and the ceramic powder phosphor as Comparative Example.

FIG. 3 is a graph showing an excitation spectrum of the phosphor according to the first embodiment and a conventional ceramic powder phosphor.

DESCRIPTION OF EMBODIMENTS

First Embodiment (Phosphor)

Figure 1:
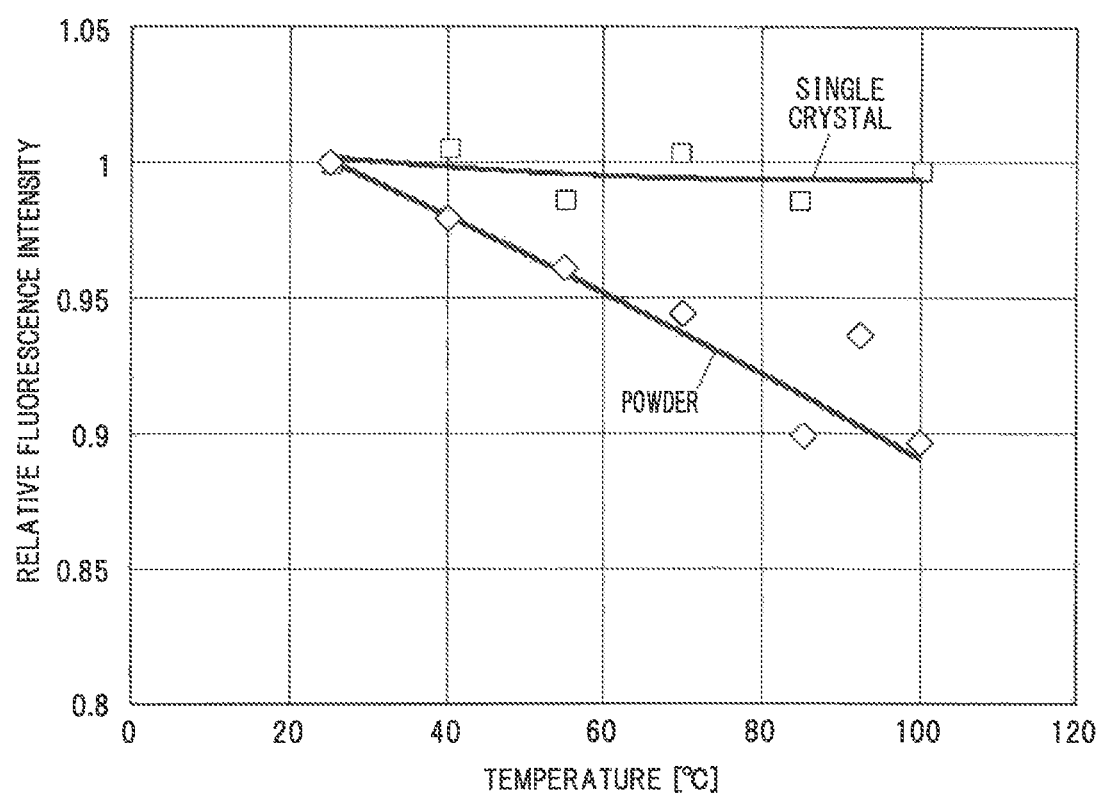
FIG. 1 is a graph showing temperature quenching characteristics of a phosphor according to a first embodiment and a ceramic powder phosphor as Comparative Example when an excitation light wavelength is 460 nm.

The phosphor according to the first embodiment is YAG based phosphor including $Y_3Al_5O_{12}$(YAG) crystal as a mother crystal, and has a composition represented by a formula of $Y_{3-x-y}L_xM_yAl_{5-z}X_zO_{12-w}$ (L is Gd or Lu, M is not less than one element selected from the group consisting of Ce, Tb, Eu, Yb, Pr, Tin, and Sm, X is Ga or In, $0 \leq x < 3$, $0 < y \leq 1$, $0 \leq z \leq 5$, $-0.2 \leq w \leq 0.2$). Here, Lisa component that replaces Y and does not become a light emission center. M is a component (an activator) that replaces Y and becomes a light emission center. In addition, X is a component that replaces Al.

In an exemplary aspect of the present invention, the YAG crystal has a composition represented by a formula of $Y_{3-x-y}Gd_xCe_yAl_5O_{12-w}$ ($0.03 \leq x \leq 0.2$, $0.003 \leq y \leq 0.2$, $-0.2 \leq w \leq 0.2$), wherein reduction of fluorescence intensity of the phosphor is less than 3% when an excitation light wavelength is 460 nm and a temperature is increased from 25° C. to 100° C.

Further, a part of atoms constituting the composition of the above-mentioned phosphor may occupy a different position on a crystal structure.

This phosphor can be obtained by a liquid phase growth method such as a CZ method (Czochralski Method), an EFG method (Edge Defined Film Fed Growth Method), a Bridgman Method, a FZ method (Floating Zone Method).

It is preferable that a concentration of the activator represented by the above-mentioned (y) is not less than 0.003 and not more than 0.2. This is because if the activator concentration is less than 0.003, a thickness (t) of the phosphor needed to obtain a fluorescence of required quantity of light becomes thicker (for example, t>3 mm), thus the number of the phosphor that can be cut from a phosphor single crystal ingot is reduced. In addition, this is because if the activator concentration is more than 0.2, the phosphor is needed to be thinned (for example, t<0.1 mm), thus due to decrease in mechanical strength, cracking or chipping easily occurs in the phosphor, and simultaneously concentration quenching may occur. Further, the concentration quenching is a phenomenon that energy transfer between molecules adjacent to each other occurs and original energy is not sufficiently emitted toward outside as a fluorescence, namely, non-light emission transition or the like occurs, thereby a fluorescence intensity does not increase dependent on increase in the concentration of the activator.

In addition, it is more preferable that the concentration of the activator represented by the above-mentioned (y) is not less than 0.01 and not more than 0.2. By satisfying y≥0.01, the phosphor can be configured to have an appropriate thickness for using it for a light emitting device (for example, t≤2 mm). Namely, it is preferable that a thickness of the activator is not less than 0.1 mm and not more than 3.0 mm, and it is more preferable that the thickness is not less than 0.1 mm and not more than 2.0 mm The phosphor according to the embodiment has excellent quantum efficiency. For example, the quantum efficiency at 25 t is not less than 92% at an excitation light wavelength of 460 nm. Particularly, in case that the phosphor is single crystals of single phase manufactured by setting the charge composition to be $Y_{2.91}Gd_{0.03}Ce_{0.06}Al_5O_2$, the quantum efficiency is 97% at an excitation light wavelength of 460 nm. In addition, in case that the phosphor is single crystals of single phase manufactured by setting the charge composition to be $Y_{2.8}Gd_{0.2}Ce_{0.06}Al_5O_{12}$, the quantum efficiency of not less than 92% can be obtained at an excitation light wavelength of 460 nm.

By using the phosphor according to the embodiment, a light emitting device having a higher brightness can be realized. The quantum efficiency of the conventional phosphor sold in market is approximately 80 to 90%, and the quantum efficiency of the invention is roughly higher than the conventional phosphor by approximately 10 to 20%. When a junction temperature is raised to 100° C. near the design upper limit temperature, a blue light emitting device is reduced in a light emission efficiency by roughly approximately 10 to 20%. By using the phosphor according to the invention, the brightness can be maintained in a level of not less than a certain lightness (in a light emitting device using a conventional phosphor, a lightness before an element temperature is raised).

In addition, for example, according to a Table A1.3 of a literature "Solid-State Lighting Research and Development: Multi Year Program Plan March 2011 (Updated May 2011) P. 69", it is described that a numerical value in 2010 of quantum efficiency (Quantum Yield (25° C.) across the visible spectrum) is 90% and a target value in 2020 is 95%. From this, it is known that enhancement in quantum efficiency of approximately 1% in two years is expected in this industry, and it can be said that the phosphor according to the embodiment is an excellent phosphor that has quantum efficiency beyond the numerical value targeted at the time of filing the application.

In addition, the phosphor according to the embodiment has excellent temperature quenching characteristics. For example, when the excitation light wavelength is 460 nm and the temperature is increased from 25 to 100° C., the fluorescence intensity is reduced less than 3%.

FIG. 1 is a graph showing temperature dependency of the fluorescence intensity of the phosphor according to the first embodiment and the conventional ceramic powder phosphor as Comparative Example, when the excitation light wavelength is 460 nm. The horizontal axis of the graph represents a temperature [C] of the phosphor and the vertical axis represents a relative fluorescence intensity based on the fluorescence intensity of the phosphor at 25° C.

The upper line of FIG. 1 is a line showing temperature dependency of the fluorescence intensity of the phosphor according to the embodiment, which is obtained based on measurement values of each time shown as a square symbol of the fluorescence intensity of the phosphor according to the embodiment. The lower line of FIG. 1 is a line showing temperature dependency of the fluorescence intensity of the conventional ceramic powder phosphor, which is obtained based on measurement values of each time shown as a diamond-shaped symbol of the fluorescence intensity of the conventional ceramic powder phosphor.

As shown in FIG. 1, the upper line is near a horizontal line, and the temperature dependency of the fluorescence intensity of the phosphor according to the embodiment is small. For example, reduction of the fluorescence intensity of the phosphor according to the embodiment when the temperature is increased from 25 to 100° C. can be approximated to less than 1%, and it is clearly known to be less than 3%.

On the other hand, the lower line is inclined in a large way, and the temperature dependency of the fluorescence intensity of the conventional ceramic powder phosphor is larger than that of the phosphor according to the embodiment. For example, reduction of the fluorescence intensity of the conventional ceramic powder phosphor when the temperature is increased from 25 to 100° C. can be approximated to not less than 10%.

Therefore, it can be said that the phosphor according to the embodiment has excellent temperature characteristics in comparison with the conventional ceramic powder phosphor for the reason of small reduction of the fluorescence intensity dependent on temperature increase. Thus, the phosphor according to the embodiment can be used for a light emitting device that has a higher output than a conventional device (for example, not less than 5 W).

In addition, for example, according to the Table A1.3 of the literature "Solid-State Lighting Research and Development: Multi Year Program Plan March 2011 (Updated May 2011) P. 69", it is described that a numerical value in 2010 of temperature characteristics (from 25 to 150° C.) is 90% (reduction 10%) and a target value in 2020 is 95% (reduction 5%), and it can be said that the phosphor according to the embodiment is a phosphor that approximately satisfies the target value.

In addition, the phosphor according to the embodiment has a characteristic that when the excitation light wavelength is varied, variation of the fluorescence wavelength is small. For example, when the excitation light wavelength is varied from 460 nm to 480 nm, variation of the fluorescence wavelength of which relative fluorescence intensity thereof is 0.5 is not more than 1.5 nm.

FIG. 2 is a graph showing excitation light wavelength dependency of the fluorescence spectrum of the phosphor according to the first embodiment and the conventional ceramic powder phosphor as Comparative Example. The horizontal axis of FIG. 2 represents a wavelength of the fluorescence and the vertical axis represents a relative intensity in case that the maximum value of the fluorescence spectrum intensity is given as 1.0.

In FIG. 2, the fluorescence spectrum of the phosphor according to the embodiment when the excitation light wavelength is 460 nm and 480 nm and the fluorescence spectrum of the conventional ceramic powder phosphor when the excitation light wavelength is 460 nm and 480 nm are shown.

As shown FIG. 2, a difference in a waveform between the fluorescence spectrum of the phosphor according to the embodiment when the excitation light wavelength is 460 nm and the fluorescence spectrum thereof when the excitation light wavelength is 480 nm is smaller than a difference in a waveform between the fluorescence spectrum of the conventional ceramic powder phosphor when the excitation light wavelength is 460 nm and the fluorescence spectrum thereof when the excitation light wavelength is 480 nm.

For example, in the phosphor according to the embodiment, variation of the full width at half maximum (FWHM) (width of a part in which the relative fluorescence intensity is 0.5) of the fluorescence spectrum when the excitation light wavelength is varied from 460 nm to 480 nm is 1.5 nm, while in the conventional ceramic powder phosphor, the variation is 2.7 nm. W1 and W2 in FIG. 2 respectively show the full width at half maximum (FWHM) of the fluorescence spectrum of the phosphor according to the embodiment when the excitation light wavelength is 460 nm and 480 nm. In addition, W3 and W4 respectively show the full width at half maximum (FWHM) of the fluorescence spectrum of the conventional ceramic powder phosphor when the excitation light wavelength is 460 nm and 480 nm. Namely, a difference between W1 and W2 is 1.5 nm and a difference between W3 and W4 is 2.7 nm.

The phosphor according to the embodiment is configured such that variation of the fluorescence spectrum to the excitation light wavelength is small, thus by using the phosphor according to the embodiment, a light emitting device configured such that characteristics variation is smaller can be fabricated.

FIG. 3 is a graph of an excitation spectrum measured at 570 nm of the phosphor according to the first embodiment and the conventional ceramic powder phosphor as Comparative Example. The horizontal axis of FIG. 3 represents an excitation wavelength [nm] and the vertical axis represents a fluorescence intensity (relative value). As shown in FIG. 3, an excitation range of the phosphor according to the embodiment is less than an excitation range of the conventional ceramic powder phosphor, and an advantageous effect of preventing a loss due to re-excitation can be expected. For example, the full width at half maximum (FWHM) W6 of the excitation spectrum of the phosphor according to the embodiment is approximately 69 nm, and is less than the full width at half maximum (FWHM) W5 of the excitation spectrum of the conventional ceramic powder phosphor, W5 being approximately 83 nm.

Figure 4A:
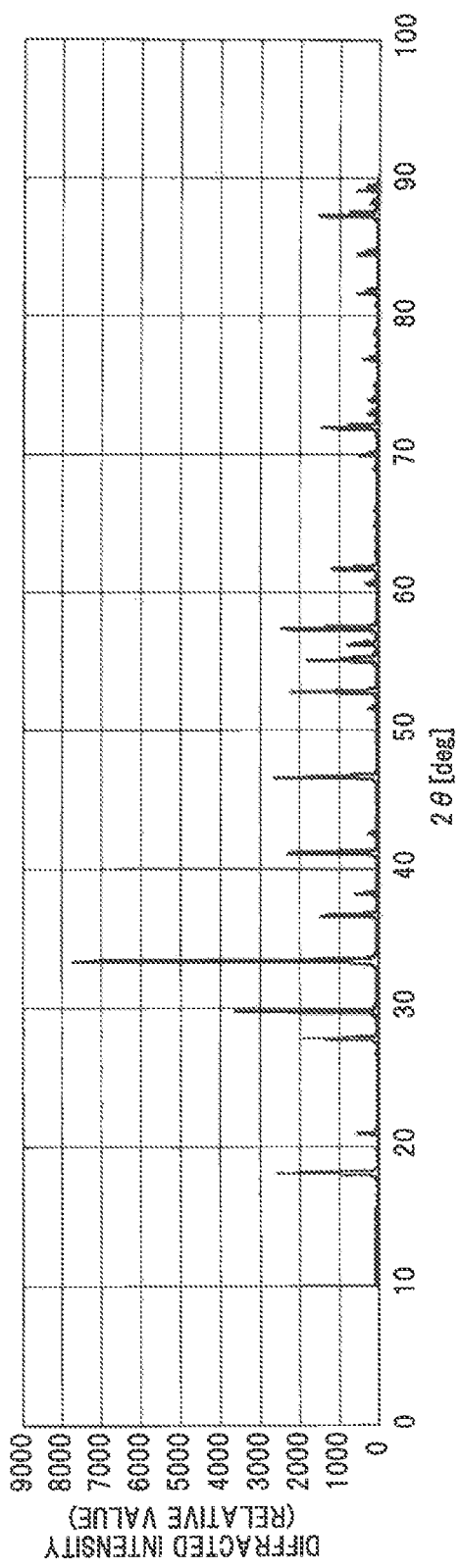
FIG. 4A is a graph showing a powder X-ray diffraction pattern of the phosphor according to the first embodiment.
Figure 4B:
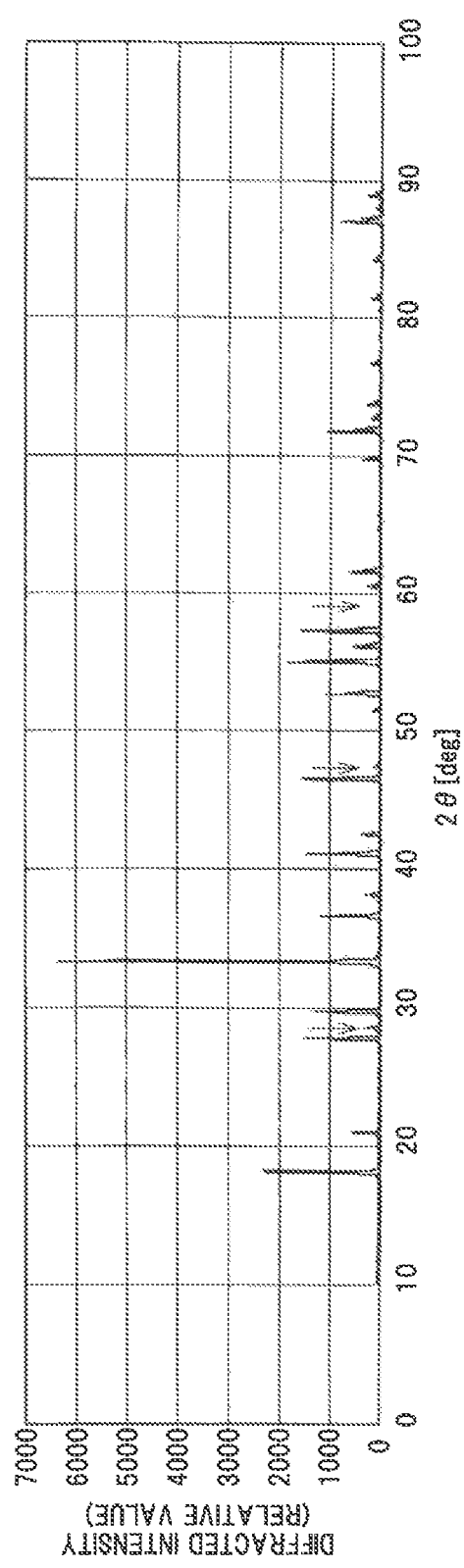
FIG. 4B is a graph showing a powder X-ray diffraction pattern of the conventional ceramic powder phosphor as Comparative Example.

In addition, the phosphor according to the embodiment is characterized in being a garnet single phase. FIG. 4A and FIG. 4B are respectively a graph showing a powder X-ray diffraction pattern of the phosphor according to the first embodiment and the conventional ceramic powder phosphor as Comparative Example. The horizontal axis of FIG. 4A and FIG. 4B represents a diffraction angle and the vertical axis represents a diffraction intensity.

Peaks indicated by arrows in the diffraction pattern of FIG. 4B are peaks due to the second phase other than the garnet structure. Namely, in the conventional ceramic powder phosphor, the second phase other than the garnet structure is included. On the other hand, as shown in FIG. 4A, in the X-ray diffraction pattern of the phosphor according to the embodiment, the peaks due to the second phase are not observed, and it can be said that the phosphor according to the embodiment is a single phase.

In addition, the phosphor according to the embodiment is characterized in having high purity without including the group 2 element such as Ba, Sr and the group 17 element such as F, Br. Due to these characteristics, a light emitting device having a high brightness and a long lifetime can be realized.

Hereinafter, one example of a manufacturing method of the phosphor according to the embodiment will be explained. In the example described below, YAG single crystal phosphor including Ce, Gd is grown by Czochralski Method (CZ method).

(Manufacturing of Powder)

First, high purity (not less than 99.99%) powders of $Y_2O_3$, $Al_2O_3$, $CeO_2$, $Gd_2O_3$ are prepared as starting materials, dry mixing is carried out, so as to obtain mixed powders. Further, raw powders of Y, Al, Ce, and Gd are not limited to the above-mentioned compounds.

For example, in case of growing $Y_{2.91}Gd_{0.03}Ce_{0.06}Al_5O_{12-w}$ ($-0.2 \leq w \leq 0.2$) single crystal, $Y_2O_3$ powder, $Al_2O_3$ powder, $Gd_2O_3$ powder, $CeO_2$ powder are mixed in a molar ratio of 2.91:5:0.03:0.12.

Figure 5:
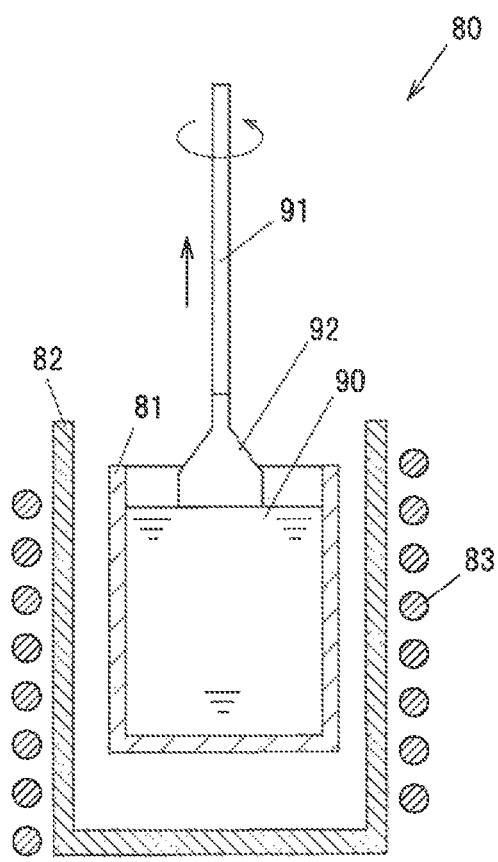
FIG. 5 is a cross-sectional view schematically showing a pulling up of YAG single crystal phosphor by CZ method.

FIG. 5 is a cross-sectional view schematically showing a pulling up of YAG single crystal phosphor by CZ method. A crystal growth device 80 mainly includes a crucible 81 comprised of iridium, a cylindrical container 82 comprised of ceramics configured to accommodate the crucible 81, and a high frequency coil 83 configured to be wound around the cylindrical container 82.

The mixed powders obtained are put into the crucible 81, an inducted current is generated in the crucible 81 by the high frequency coil 83 at high frequencies of 30 kW in a nitrogen atmosphere, and the crucible 81 is heated. By this, the mixed powders are melted and a melt 90 is obtained.

Next, a seed crystal 91 of YAG single crystal is prepared, after the tip thereof is dipped in the melt 90, YAG single crystal phosphor 92 is pulled up toward <111> direction, at a pull-up speed of not more than 1 mm/h, and at a pull-up temperature of not less than 1960° C., while the seed crystal 91 is rotated at a rotation speed of 10 rpm. The pulling-up of YAG single crystal phosphor 92 is carried out in such a way that nitrogen is poured into the cylindrical container 82 at a flow rate of 2 L per minute, under atmospheric pressure, and in a nitrogen atmosphere. Thus, for example, YAG single crystal phosphor 92 having a diameter of an approximately 2.5 cm and a length of approximately 5 cm is obtained.

YAG single crystal phosphor 92 is cut out to a desired size, thereby, for example, a single crystal phosphor having a plate-like shape that is used for a light emitting device can be obtained. In addition, YAG single crystal phosphor 92 is crushed, thereby a granular phosphor can be obtained.

In order to manufacture the phosphor according to the embodiment, in the above-mentioned manufacturing method, the pull-up temperature and the pull-up speed of the single crystal are particularly important. The inventors et al. have found that Gd is added to YAG, thereby melting point is extremely increased, thus it is needed that the pull-up temperature that is higher than a normal pull-up temperature of YAG single crystal of Gd no addition, the pull-up temperature needed being not less than 1960° C. In addition, in order to prevent an occurrence of a defect such as cavity, bubble, crack, it is required that the pull-up speed that is slower than a normal pull-up speed of YAG single crystal of Gd no addition, the pull-up speed required being not more than 1 mm/h.

In addition, according to the manufacturing method, YAG single crystal phosphor 92 can be grown by using $CeO_2$ as a raw material of Ce. In order to exert functions as a phosphor, it is required that Ce is included in YAG crystal in a trivalent state, thus it is considered that it is easier to incorporate Ce into YAG crystal in a trivalent state by using $Ce_2O_3$ or Ce organic compound in which Ce is included in a trivalent state as the starting material, than by using $Ce_2O_3$ in which Ce is included in a tetravalent state as the starting material. On the other hand, $Ce_2O_3$ or Ce organic compound has a defect of being extremely expensive in comparison with $CeO_2$. According to the manufacturing method, even if $CeO_2$ is used, Ce can be added to the crystal in a trivalent state, thus a phosphor can be manufactured at a low cost.

Second Embodiment

Figure 6A:
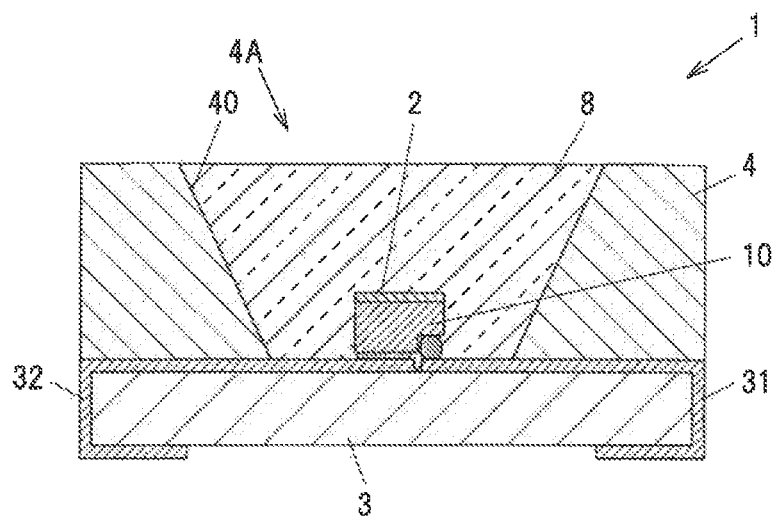
FIG. 6A is a cross-sectional view showing a light emitting device according to a second embodiment.
Figure 6B:
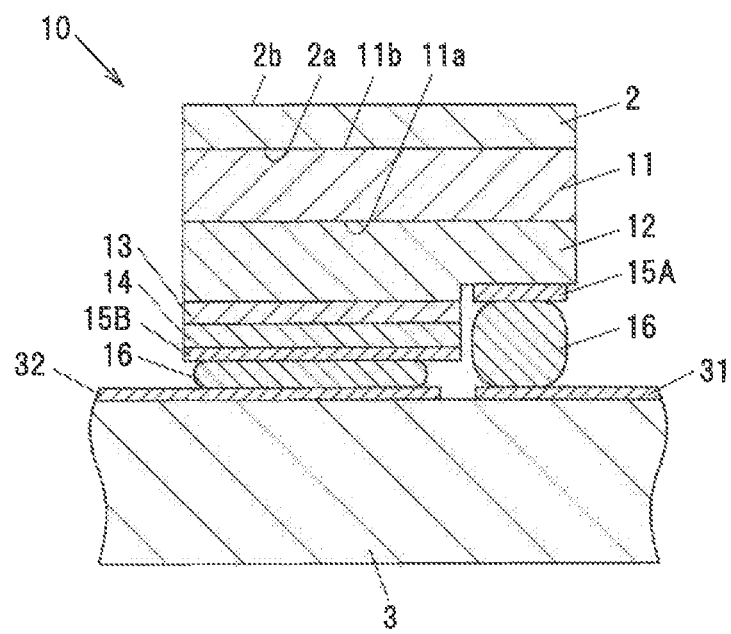
FIG. 6B is a cross-sectional view showing a light emitting element and the peripheral part thereof constituting the light emitting device according to the second embodiment.

The second embodiment of the invention is a light emitting device using the phosphor according to the phosphor according to the embodiment. Hereinafter, the second embodiment will be explained referring to FIG. 6A and FIG. 6B. FIG. 6A is a cross-sectional view showing a light emitting device 1 according to the second embodiment, and FIG. 6B is a cross-sectional view showing a light emitting element 10 and the peripheral part thereof constituting the light emitting device 1.

As shown in FIG. 6A, the light emitting device 1 is configured to include the light emitting element 10 comprised of LED, the phosphor 2 including a single crystal disposed in such a manner that the light emission surface of the light emitting element 10 is covered, the ceramic substrate 3 of $Al_2O_3$ or the like supporting the light emitting element 10 and the main body 4 comprised of a white resin and the transparent resin 8 sealing the light emitting element 10 and the phosphor 2.

The ceramic substrate 3 has wiring parts 31, 32, for example, pattern-formed by a metal such as tungsten. The wiring parts 31, 32 are electrically connected to the n-side electrode 15A and the p-side electrode 15B (described below) of the light emitting element 10.

The main body 4 is formed on the ceramic substrate 3, and the opening part 4A is formed in the center part thereof. The opening part 4A is formed in a tapered shape that the opening width gradually becomes large from the side of the ceramic substrate 3 toward the outside. The inner surface of the opening part 4A is configured to be the reflection surface 40 configured to reflect the emission light of the light emitting element 10 toward the outside.

As shown in FIG. 6B, the light emitting element 10 is mounted on the ceramic substrate 3 in such a way that the n-side electrode 15A and the p-side electrode 15B thereof are connected to the wiring parts 31, 32 of the ceramic substrate 3 via bumps 16, 16.

The light emitting element 10 is configured to, for example, be a flip-chip type using a GaN based semiconductor compound, for example, emit a blueish light that has a peak of quantity of light at a wavelength of 380 to 490 nm. The light emitting element 10 is configured such that on the first main substrate 11a of the element substrate 11 comprised of sapphire or the like, the n-type GaN layer 12, the light emitting layer 13 and the p-type GaN layer 14 are formed in this order. On the exposed part of the n-type GaN layer 12, the n-side electrode 15A is formed, and on the surface of the p-type GaN layer 14, the p-side electrode 15B is formed.

The light emitting layer 13 is configured to emit a blueish light by that carriers are poured from the n-type GaN layer 12 and the p-type GaN layer 14. The emission light is transmitted through the n-type GaN layer 12 and the element substrate 11 so as to be emitted from the second main substrate 11b of the element substrate 11. Namely, the second main substrate 11b of the element substrate 11 is a light emission surface of the light emitting element 10.

In addition, on the side of the second main substrate 11b of the element substrate 11, the phosphor 2 is arranged so as to cover the whole of the second main substrate 11b. The phosphor 2 is comprised of YAG-based phosphor according to the first embodiment.

The phosphor 2 is a single crystal phosphor of a flat plate-like shape, the whole thereof being including a single crystal. Here, the single crystal means a single crystal configured such that the whole thereof is substantially considered as one single crystal. The phosphor 2 has a size equal to or more than the second main substrate 11b. In addition, the phosphor 2 is configured such that the first surface 2a facing the element substrate 11 is directly brought into contact with the element substrate 11 without interposing other members between the second main substrate 11b of the element substrate 11. The phosphor 2 and the element substrate 11 are connected by intermolecular force.

When electric power is fed to the light emitting element 10 configured as described above, electrons are poured into the light emitting layer 13 via the wiring part 31, the n-side electrode ISA and the n-type GaN layer 12, and positive holes are poured into the light emitting layer 13 via the wiring part 32, the p-side electrode 15B and the p-type GaN layer 14, so that the light emitting layer 13 emits a light. The blue emission light of the light emitting layer 13 passes through the n-type GaN layer 12 and the element substrate 11 so as to be emitted from the second main substrate 11b of the element substrate 11 and be inputted into the first surface 2a of the phosphor 2.

A part of the light inputted from the first surface 2a excites electrons in the phosphor 2 as an excitation light. The phosphor 2 absorbs a part of the blueish light from the light emitting element 10, and wavelength-converts the absorbed light to, for example, a yellowish light having a peak of quantity of light at a wavelength of 500 to 630 nm.

A part of the blueish light inputted into the phosphor 2 is absorbed in the phosphor 2 and is wavelength-converted so as to be emitted from the second surface 2b of the phosphor 2 as a yellowish light. In addition, a remaining part of the light inputted into the phosphor 2 is not absorbed in the phosphor 2 and is emitted from the second surface 2b of the phosphor 2. A blue light and a yellow light have a complementary color relation, thus the light emitting device 1 emits a white light obtained by mixing a blue light and a yellow light.

In addition, it is preferable that the color temperature of the white light emitted from the light emitting device 1 is 3800 to 7000 K. It is more preferable that the color temperature of the white light of the light emitting device 1 is 4000 to 5500 K. The color temperature of the white light can be adjusted by the activator concentration, the thickness, or the like of the phosphor 2.

Third Embodiment

Next, the third embodiment of the invention will be explained referring to FIG. 7A, FIG. 7B and FIG. 7C. FIG.

Figure 7A:
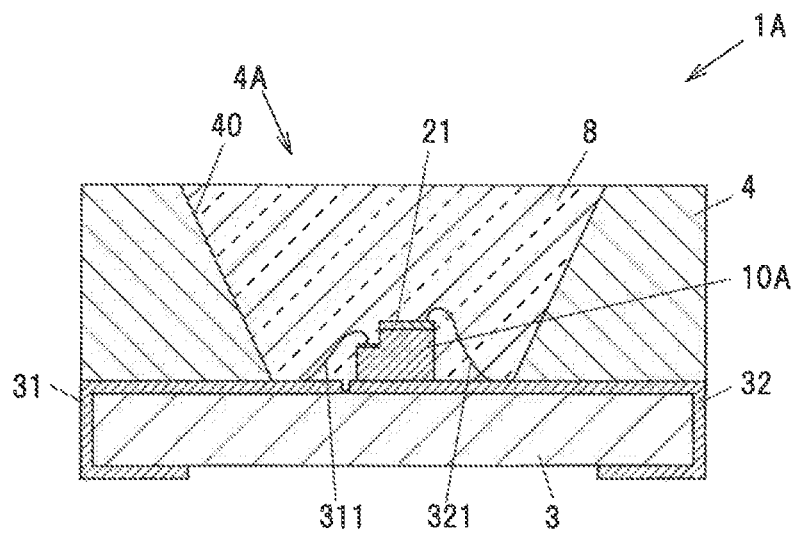
FIG. 7A is a cross-sectional view showing a light emitting device according to a third embodiment
Figure 7B:
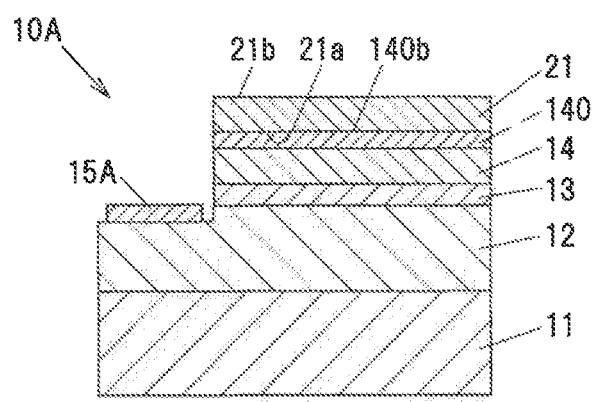
FIG. 7B is a cross-sectional view showing a light emitting element constituting the light emitting device according to the third embodiment.
Figure 7C:
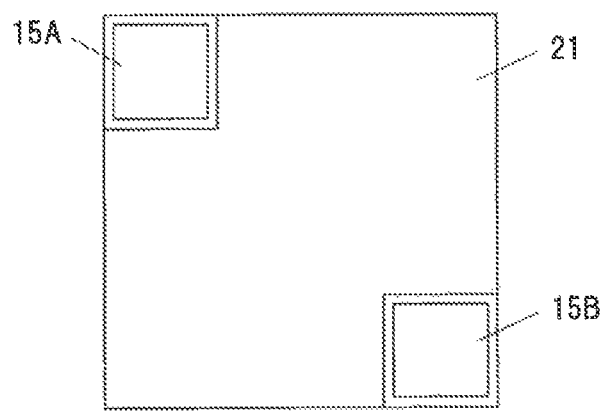
FIG. 7C is a plan view showing the light emitting element according to the third embodiment.

7A is a cross-sectional view showing a light emitting device 1A according to the third embodiment, FIG. 7B is a cross-sectional view showing a light emitting element 10A constituting the light emitting device 1A according to the third embodiment and FIG. 7C is a plan view showing the light emitting element 10A.

The light emitting device 1A according to the embodiment has the same configuration as the configuration of the light emitting device 1 according to the second embodiment, that the emission light of the light emitting element is inputted into the phosphor comprised of a single crystal so as to carry out the wavelength-conversion, but has a different configuration from the second embodiment in the structure of the light emitting element and the arrangement position of the phosphor to the light emitting element. Hereinafter, with regard to the components of the light emitting device 1A having the same function and the configuration as those explained in the second embodiment, the same reference signs as used in the second embodiment will be used, and the explanation will be omitted.

As shown in FIG. 7A and FIG. 7B, the light emitting device 1A is arranged in such a manner that the element substrate 11 of the light emitting element 10A faces the side of the ceramic substrate 3. In addition, the phosphor 21 is connected to the side of the opening part 4A of the light emitting element 10A. The phosphor 21 is comprised of the YAG based phosphor according to the first embodiment as well as the phosphor according to the second embodiment.

As shown in FIG. 7B and FIG. 7C, the light emitting element 10A includes the element substrate 11, the n-type GaN layer 12, the light emitting layer 13 and the p-type GaN layer 14, and further includes the transparent electrode 140 comprised of ITO (Indium Tin Oxide) on the p-type GaN layer 14. On the transparent electrode 140, the p-side electrode 15B is formed. The transparent electrode 140 is configured to diffuse carriers poured from the p-side electrode 15B so as to pour into the p-type GaN layer 14.

The phosphor 21, as shown in FIG. 7C, is formed in an approximately square shape that has notches in the parts corresponding to the p-side electrode 15B and the n-side electrode 15A formed on the n-type GaN layer 12. In addition, the phosphor 21 is configured such that the first surface 21a is connected to the front surface 140b of the transparent electrode 140 by intermolecular force. The phosphor 21 has the same composition as the phosphor 2 according to the first embodiment.

As shown in FIG. 7A, the n-side electrode 15A of the light emitting element 10A is connected to the wiring part 31 of the ceramic substrate 3 by the bonding wire 311. In addition, the p-side electrode 15B is connected to the wiring part 32 of the ceramic substrate 3 by the bonding wire 321.

When electric power is fed to the light emitting element 10A configured as described above, electrons are poured into the light emitting layer 13 via the wiring part 31, the n-side electrode 15A and the n-type GaN layer 12, and positive holes are poured into the light emitting layer 13 via the wiring part 32, the p-side electrode 15B, the transparent electrode 140 and the p-type GaN layer 14 so that the light emitting layer 13 emits a light.

The blue emission light of the light emitting layer 13 is transmitted through the p-type GaN layer 14 and the transparent electrode 140 so as to be emitted from the front surface 140b of the transparent electrode 140. Namely, the front surface 140b of the transparent electrode 140 is a light emission surface of the light emitting element 10A. The light emitted from the front surface 140b of the transparent electrode 140 is inputted into the first surface 21a of the phosphor 21.

A part of the light inputted into the phosphor 21 from the first surface 21a excites electrons in the phosphor 21 as an excitation light. The phosphor 21 absorbs a part of the blue light from the light emitting element 10A, and wavelength-converts the absorbed light mainly to a yellow light. In more detail, the phosphor 21 absorbs a blueish light having a light emission peak at a wavelength of 380 to 490 nm from the light emitting element 10A, and emits a yellowish light having a light emission peak at a wavelength of 500 to 630 nm.

As mentioned above, a part of the blue light inputted into the phosphor 21 is absorbed in the phosphor 21 and is wavelength-converted so as to be emitted from the second surface 21b of the phosphor 21 as a yellow light. In addition, a remaining part of the light inputted into the phosphor 21 is not absorbed in the phosphor 21 and is emitted from the second surface 21b of the phosphor 21 as it is. A blue light and a yellow light have a complementary color relation, thus the light emitting device 1A emits a white light obtained by mixing a blue light and a yellow light.

Fourth Embodiment

Figure 8:
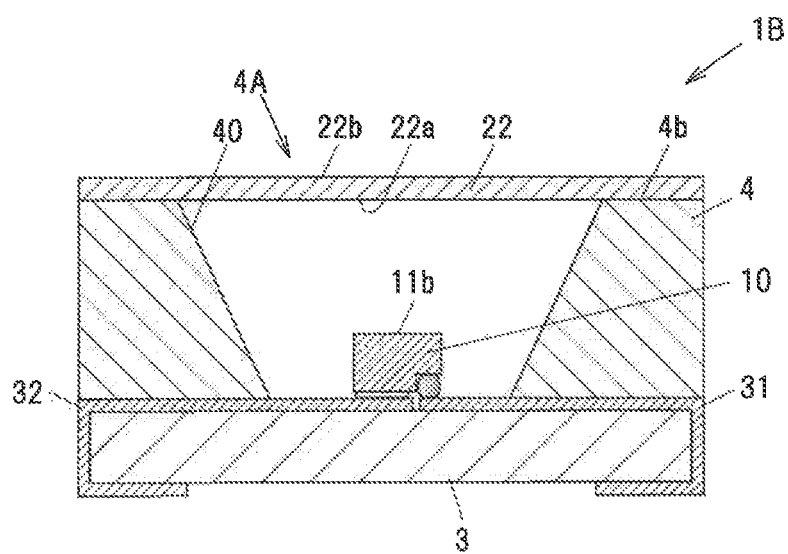
FIG. 8 is a cross-sectional view showing a light emitting device according to a fourth embodiment.

Next, the fourth embodiment of the invention will be explained referring to FIG. 8. FIG. 8 is a cross-sectional view showing a light emitting device 1B according to the fourth embodiment.

The light emitting device 1B according to the embodiment has the same configuration as the configuration of the light emitting device 1 according to the second embodiment, that the emission light of the light emitting element is inputted into the phosphor including a single single crystal so as to carry out the wavelength-conversion, but has a different configuration from the second embodiment in the arrangement position of the phosphor. Hereinafter, with regard to the components of the light emitting device 1B having the same function and the configuration as those explained in the second or third embodiment, the same reference signs as used in the second or third embodiment will be used, and the explanation will be omitted.

As shown in FIG. 8, the light emitting device 1B includes the light emitting element 10 that has the same configuration as the second embodiment on the ceramic substrate 3. The light emitting element 10 emits a blue light from the second main substrate 11b of the element substrate 11 (refer to FIG. 6B) located in the side of the opening part 4A of the main body 4 toward the side of the opening part 4A of the main body 4.

To the main body 4, the phosphor 22 is connected in such a manner that the opening part 4A is covered. The phosphor 22 is formed in a flat plate-like shape and is connected to the upper surface 4b of the main body 4 by an adhesive agent or the like. The phosphor 22 is comprised of the YAG based phosphor according to the first embodiment as well as the phosphor according to the second embodiment. In addition, the phosphor 22 is larger than the light emitting element 10 and is configured such that the whole thereof is substantially one single crystal.

When electric power is fed to the light emitting device 1B configured as described above, the light emitting element 10 emits a light so as to emit a blue light from the second main substrate 11b toward the phosphor 22. The phosphor 22 absorbs the blue emission light of the light emitting element 10 from the first surface 22a facing the light emission surface of the light emitting element 10 so as to emit a yellow fluorescent light from the second surface 22b to the outside.

As mentioned above, a part of the blue light inputted into the phosphor 22 is absorbed in the phosphor 22 and is wavelength-converted so as to be emitted from the second surface 22b of the phosphor 22 as a yellow light. In addition, a remaining part of the light inputted into the phosphor 22 is not absorbed in the phosphor 22 and is emitted from the second surface 22b of the phosphor 22. A blue light and a yellow light have a complementary color relation, thus the light emitting device 1B emits a white light obtained by mixing a blue light and a yellow light.

In the embodiment, the light emitting element 10 and the phosphor 22 are separately arranged from each other, thus a large sized phosphor 22 can be used so that easiness of assembly of the light emitting device 1B can be heightened in comparison with a case that the phosphor is connected to the light emission surface of the light emitting element 10.

Fifth Embodiment

Figure 9:
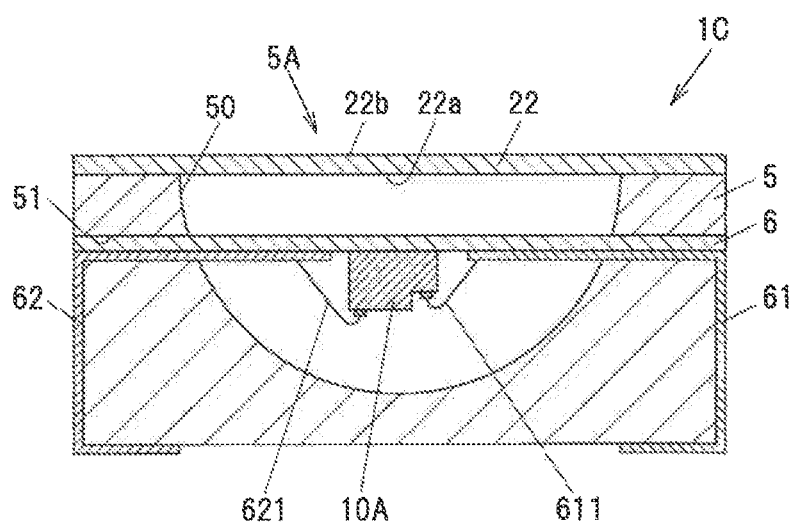
FIG. 9 is a cross-sectional view showing a light emitting device according to a fifth embodiment.

Next, the fifth embodiment of the invention will be explained referring to FIG. 9. FIG. 9 is a cross-sectional view showing a light emitting device 1C according to the fifth embodiment. As shown in FIG. 9, the embodiment is different from the fourth embodiment in a positional relationship between the light emitting element, and the substrate on which the light emitting element is mounted and the phosphor. Hereinafter, with regard to the components of the light emitting device 1C having the same function and the configuration as those explained in the second, third or fourth embodiment, the same reference signs as used in the second, third or fourth embodiment will be used, and the explanation will be omitted.

The light emitting device 1C according to the embodiment is configured to include the main body 5 comprised of a white resin, the transparent substrate 6 held by the holding part 51 of a slit-like shape formed in the main body 5, the phosphor 22 comprised of YAG based single single crystal arranged so as to cover the opening part 5A of the main body 5, the light emitting element 10A mounted on the surface of the transparent substrate 6, the surface being on the side opposite to the phosphor 22 side, and the wiring parts 61, 62 configured to feed electric power. The phosphor 22 is comprised of the YAG based phosphor according to the first embodiment as well as the phosphor 11 according to the second embodiment.

The main body 5 is configured such that a concave portion on a curved surface is formed in the center part thereof and the surface of the concave portion constitutes the reflection surface 50 configured to reflect the emission light of the light emitting element 10A toward the side of the phosphor 22.

The transparent substrate 6 is comprised of a resin having translucency such as s silicone resin, an acrylic resin, a PET, or a member having translucency comprised of single crystals or polycrystals such as glass-like substance, sapphire, ceramics, quarts, so as to have translucency that allows the emission light of the light emitting element 10A to be transmitted and insulation. In addition, to the transparent substrate 6, a part of the wiring parts 61, 62 is connected. Intervals between the p-side electrode and the n-side electrode of the light emitting element 10A, and one end part of the wiring parts 61, 62 are electrically connected by the bonding wires 611, 621. Another end part of the wiring parts 61, 62 is pulled out to the outside of the main body 5.

When electric power is fed to the light emitting device 1C configured as described above, the light emitting element 10A emits a light, and one part of the emission light is transmitted through the transparent substrate 6 so as to be inputted into the first surface 22a of the phosphor 22. In addition, another part of the light emitting element 10A is reflected by the reflection surface 50 of the main body 5 and is transmitted through the transparent substrate 6 so as to be inputted into the first surface 22a of the phosphor 22.

A part of the light inputted into the phosphor 22 is absorbed in the phosphor 22 and is wavelength-converted, and a remaining part of the light is not absorbed in the phosphor 22 so as to be emitted from the second surface 22b of the phosphor 22. Thus, the light emitting device 1C emits a white light obtained by mixing a blue light emitted from the light emitting element 10A and a yellow light wavelength-converted by the phosphor 22.

According to the embodiment, the light emitted from the light emitting element 10A toward the side opposite to the phosphor 22 side is reflected by the reflection surface 50 and is transmitted through the transparent substrate 6 so as to be inputted into the phosphor 22, thus light extraction efficiency of the light emitting device 1C becomes high.

Sixth Embodiment

Figure 10A:
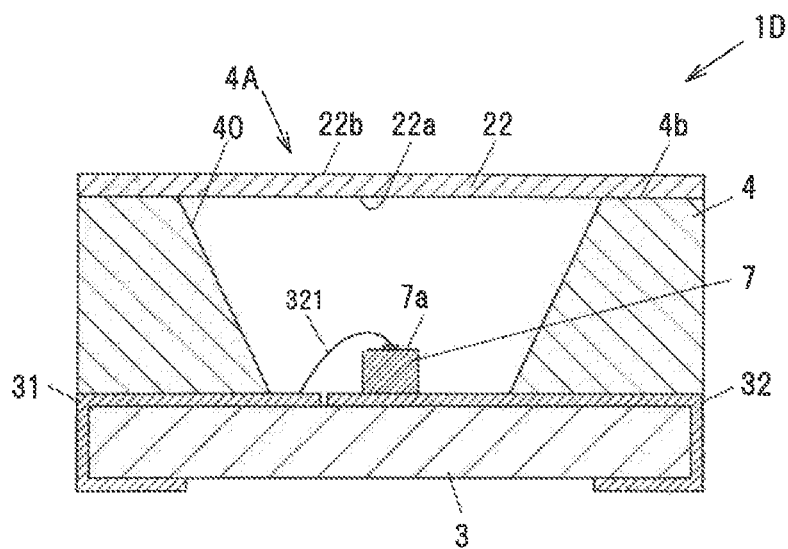
FIG. 10A is a cross-sectional view showing a light emitting device according to a sixth embodiment.
Figure 10B:
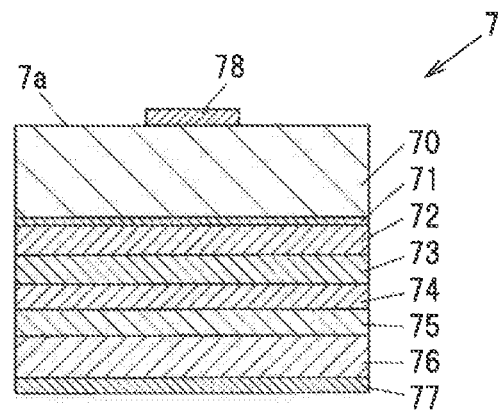
FIG. 10B is a cross-sectional view showing the light emitting element constituting the light emitting device according to the sixth embodiment.

Next, the sixth embodiment of the invention will be explained referring to FIG. 10A and FIG. 10B. FIG. 10A is a cross-sectional view showing a light emitting device 1D according to the sixth embodiment, and FIG. 10B is a cross-sectional view showing the light emitting element 7 constituting the light emitting device 1D. As shown in FIG. 10A, the embodiment is different from the fourth embodiment in the configuration and arrangement of the light emitting element 7. Hereinafter with regard to the components of the light emitting device 1D having the same function and the configuration as those explained in the second, third or fourth embodiment, the same reference signs as used in the second, third or fourth embodiment will be used, and the explanation will be omitted.

The light emitting device 1D is configured such that the light emitting element 7 is arranged on the wiring part 32 disposed in the ceramic substrate 3. The light emitting element 7 is formed by laminating the $Ga_2O_3$ substrate 70, the buffer layer 71, the Si doped n+-GaN layer 72, the Si doped n-AlGaN layer 73, the MQW (Multiple-Quantum Well) layer 74, the Mg doped p-AlGaN layer 75, the Mg doped p+-GaN layer 76 and the p-electrode 77 in this order. In addition, the n-electrode 78 is disposed on the surface of the $Ga_2O_3$ substrate 70 on the side opposite to the buffer layer 71.

The $Ga_2O_3$ substrate 70 is comprised of β-$Ga_2O_3$ that shows a conductive type of n-type. The MQW layer 74 is a light emitting layer that has a multiple quantum well structure of InGaN/GaN. The p-electrode 77 is a transparent electrode comprised of ITO (Indium Tin Oxide), and is electrically connected to the wiring part 32. The n-electrode 78 is connected to the wiring part 31 of the ceramic substrate 3 by the bonding wire 321. Further, as the element substrate, SiC can be used instead of β-$Ga_2O_3$.

When electric power is fed to the light emitting element 7 configured as described above, electrons are poured into the MQW layer 74 via the n-electrode 78, the $Ga_2O_3$ substrate 70, the buffer layer 71, the n+-GaN layer 72 and the n-AlGaN layer 73, and positive holes are poured into the MQW layer 74 via the p-electrode 77, the p+-GaN layer 76 and the p-AlGaN layer 75 so as to emit a blueish light. This blueish emission light is transmitted through the $Ga_2O_3$ substrate 70 and the like and is emitted from the light emission surface 7a of the light emitting element 7 so as to be inputted into the first surface 22a of the phosphor 22.

The phosphor 22 absorbs the blueish emission light of the light emitting element 10 from the first surface 22a facing the light emission surface of the light emitting element 7 so as to emit a yellow fluorescent light from the second surface 22b to the outside.

As mentioned above, a part of the blue light inputted into the phosphor 22 is absorbed in the phosphor 22 and is wavelength-converted so as to be emitted from the second surface 22b of the phosphor 22 as a yellow light. In addition, a remaining part of the blue light inputted into the phosphor 22 is not absorbed in the phosphor 22 and is emitted from the second surface 22b of the phosphor 22. A blue light and a yellow light have a complementary color relation, thus the light emitting device 1D emits a white light obtained by mixing a blue light and a yellow light.

Seventh Embodiment

Figure 11:
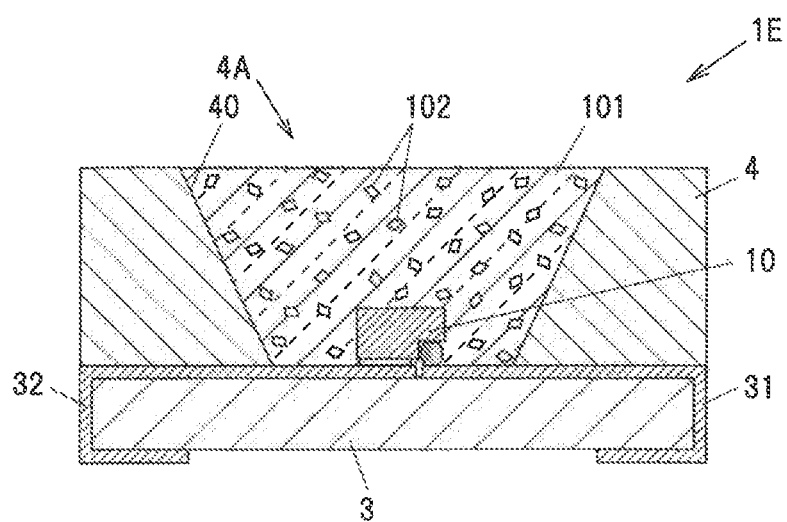
FIG. 11 is a cross-sectional view showing a light emitting device according to a seventh embodiment.

Next, the seventh embodiment of the invention will be explained referring to FIG. 11. FIG. 11 is a cross-sectional view showing a light emitting device 1E according to the seventh embodiment. As shown in FIG. 11, the embodiment is different from the second embodiment in the state and arrangement of the phosphor. Hereinafter, with regard to the components of the light emitting device 1E having the same function and the configuration as those explained in the second embodiment, the same reference signs as used in the second embodiment will be used, and the explanation will be omitted.

As shown in FIG. 11, the light emitting device 1E is configured to include the light emitting element 10 comprised of LED, the ceramic substrate 3 configured to hold the light emitting element 10, the main body 4 comprised of a white resin, and the transparent member 101 configured to seal the light emitting element 10.

In the transparent member 101, the granular phosphor 102 is dispersed. The phosphor 102 is the phosphor according to the first embodiment having a granular shape, and can be obtained, for example, by crushing the YAG single crystal phosphor 92 manufactured in the first embodiment.

The transparent member 101 is, for example, a transparent resin such that a silicone resin, an epoxy resin, or a transparent inorganic material such as glass.

The phosphor 102 dispersed in the transparent member 101 absorbs a part of a blueish light emitted from the light emitting element 10 so as to emit a yellowish fluorescent light having a wavelength of 500 to 630 nm. The blueish light that is not absorbed in the phosphor 102 and the yellowish fluorescent light emitted from the phosphor 102 are mixed so that a white light is emitted from the light emitting device 1E.

Further, the transparent member 101 and the phosphor 102 of the embodiment can be applied to the other embodiments. Namely, the transparent member 101 and the phosphor 102 of the embodiment can be used instead of the transparent resin 8 and the phosphor 21 of the third embodiment.

Eighth Embodiment

Figure 12A:
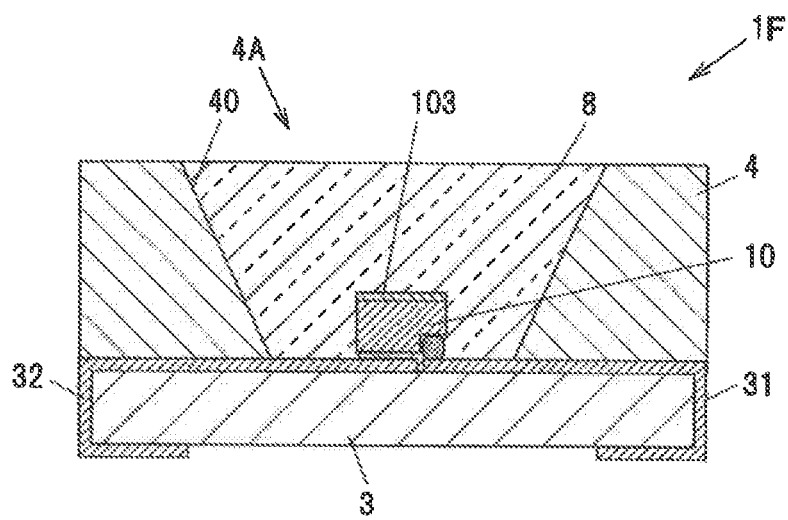
FIG. 12A is a cross-sectional view showing a light emitting device according to an eighth embodiment.
Figure 12B:
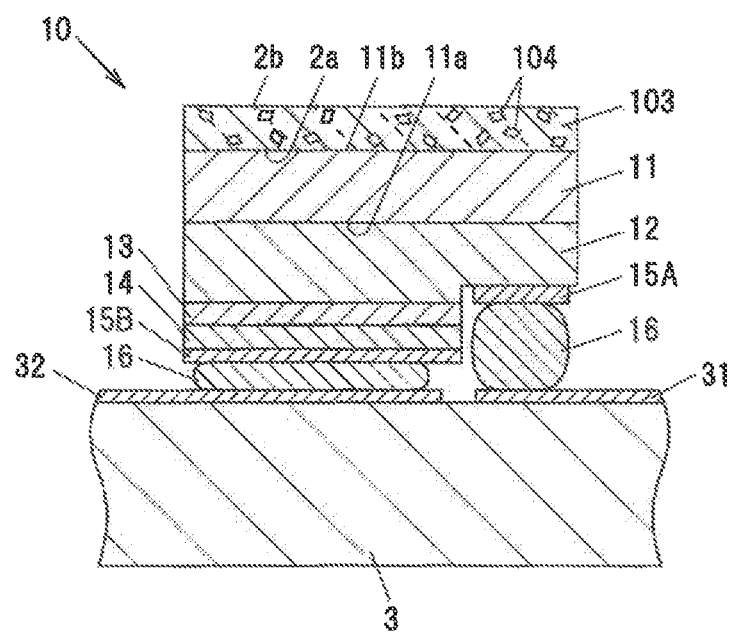
FIG. 12B is a cross-sectional view showing the light emitting element and the peripheral part thereof constituting the light emitting device according to the eighth embodiment.

Next, the eighth embodiment of the invention will be explained referring to FIG. 12A and FIG. 12B. FIG. 12A is a cross-sectional view showing a light emitting device 1F according to the eighth embodiment, and FIG. 12B is a cross-sectional view showing the light emitting element 10 and the peripheral part thereof constituting the light emitting device 1F according to the eighth embodiment. As shown in FIG. 12A and FIG. 12B, the embodiment is different from the second embodiment in the state and arrangement of the phosphor. Hereinafter, with regard to the components of the light emitting device 1E having the same function and the configuration as those explained in the second embodiment, the same reference signs as used in the second embodiment will be used, and the explanation will be omitted.

As shown in FIG. 12A, the light emitting device 1F is configured to include the light emitting element 10 comprised of LED, the transparent member 103 disposed in such a manner that the light emission surface of the light emitting element 10 is covered, the ceramic substrate 3 supporting the light emitting element 10, the main body 4 comprised of a white resin, and the transparent resin 8 sealing the light emitting element 10 and the transparent member 103.

In the transparent member 103, the granular phosphor 104 is dispersed. The phosphor 104 is the phosphor according to the first embodiment having a granular shape, and can be obtained, for example, by crushing the YAG single crystal phosphor 92 manufactured in the first embodiment.

The transparent member 103 is, for example, a transparent resin such that a silicone resin, an epoxy resin, or a transparent inorganic material such as glass. The transparent member 103 has, for example, a similar shape and size to the phosphor 2 of the second embodiment.

The phosphor 104 dispersed in the transparent member 103 absorbs a part of a blueish light emitted from the light emitting element 10 so as to emit a yellowish fluorescent light having a wavelength of 500 to 630 nm. The blueish light that is not absorbed in the phosphor 104 and the yellowish fluorescent light emitted from the phosphor 104 are mixed so that a white light is emitted from the light emitting device 1F.

Further, the transparent member 103 and the phosphor 104 of the embodiment can be applied to the other embodiments. Namely, the transparent member 103 and the phosphor 104 of the embodiment can be used instead of the phosphor 21 of the third embodiment, or the phosphor 22 of the fourth, fifth or sixth embodiment.

Advantageous Effect of Embodiment

According to the above-mentioned embodiment, a phosphor excellent in a quantum efficiency and temperature quenching characteristics can be obtained. In addition, by using a phosphor excellent in a quantum efficiency and temperature quenching characteristics, a light emitting device having excellent characteristics such as a high brightness, a high output and a long lifetime can be obtained.

As is clear from the above explanation, the invention is not limited to the above-mentioned embodiments and the illustrated examples, and design change can be variously carried out within the scope of matters described in each claim. For example, one example of a manufacturing method of the phosphor is shown, but the phosphor according to the invention is not limited to a phosphor manufactured by the one example. In addition, the light emitting element and the phosphor can be sealed by a so-called shell type resin. In addition, a configuration that one light emitting device has a plurality of light emitting elements can be also adopted. Furthermore, the light emitting device can be configured by combining a plurality of phosphors including a single crystal, for example, combining a phosphor including a single crystal configured to emit a yellowish light by using a light of a light emitting element that emits a blueish light as an excitation light, and a phosphor including a single crystal configured to emit a different color light from the phosphor described above.

INDUSTRIAL APPLICABILITY

A phosphor excellent in a quantum efficiency and a manufacturing method of the same, and a light emitting device using the phosphor are provided.

REFERENCE SIGNS LIST 1, 1A, 1B, 1C, 1D Light emitting device
2, 21, 22, 102, 104 Phosphor
3 Ceramic substrate
2a, 21a, 22a First surface
2b, 21b, 22b Second surface
4, 5 Main body
51 Holding part
4A, 5A Opening part
4b Upper surface
6 Transparent substrate
10, 10A, 7 Light emitting element
11 Element substrate
11a First main substrate
11b Second main substrate
12 n-type GaN layer
13 Light emitting layer
14 p-type GaN layer
15A n-side electrode
15B p-side electrode
16 Bump
31, 32, 61, 62 Wiring part
311, 321, 611, 621 Bonding wire
40, 50 Reflection surface
140 Transparent electrode
140b Front surface
70 $Ga_2O_3$ substrate
71 Buffer layer
72 n+-GaN layer
73 n-AlGaN layer
74 MQW layer
75 p-AlGaN layer
76 p+-GaN layer
77 p-electrode
78 n-electrode
80 Crystal growth device
81 Crucible
82 Cylindrical container
83 High frequency coil
90 Melt
91 Seed crystal
92 YAG single crystal phosphor
101, 103 Transparent member

What is claimed is:

1. A phosphor-containing member, comprising:
a transparent member; and
a plurality of granular single crystal phosphors dispersed in the transparent member,
wherein each of the plurality of granular single crystal phosphors comprises a YAG crystal as a mother crystal,
wherein the plurality of granular single crystal phosphors are prepared by crushing the YAG crystal,
wherein the YAG crystal has a composition represented by a formula of $Y_{3-x-y}Gd_xCe_yAl_5O_{12-w}$ (0.03≤x≤0.2, 0.003≤y≤0.2, −0.2≤w≤0.2), and
wherein reduction of fluorescence intensity of the phosphors is less than 3% when an excitation light wavelength is 460 nm and a temperature is increased from 25° C. to 100° C.

2. The phosphor-containing member according to claim 1, wherein a quantum efficiency of the phosphors at 25° C. is not less than 92% when the excitation light wavelength is 460 nm.

3. The phosphor-containing member according to claim 1, wherein variation of a full width at half maximum (FWHM) of fluorescence spectrum of the phosphors is not more than 1.5 nm when the excitation light wavelength is varied from 460 nm to 480 nm.

4. The phosphor-containing member according to claim 1, wherein the transparent member comprises one of a silicone resin, an epoxy resin, and a transparent inorganic material.

5. The phosphor-containing member according to claim 1, wherein the transparent member comprises a transparent inorganic material comprising a glass.

6. The phosphor-containing member according to claim 1, wherein the granular single crystal phosphors absorb a part of a blueish light to emit a yellowish fluorescent light.

7. The phosphor-containing member according to claim 1, wherein the granular single crystal phosphors emit a yellowish fluorescent light having a wavelength in a range from 500 nm to 630 nm.

8. A light emitting device, comprising:
a light emitting element for emitting bluish light; and
the phosphor-containing member as defined in claim 2.

9. The light emitting device according to claim 8, wherein the light-emitting element and the phosphor-containing member are separately arranged from each other.

10. A light emitting device, comprising:
a light emitting element for emitting bluish light; and
the phosphor-containing member as defined in claim 3.

11. The light emitting device according to claim 10, wherein the light-emitting element and the phosphor-containing member are separately arranged from each other.

12. A light emitting device, comprising:
a light emitting element for emitting bluish light; and
the phosphor-containing member as defined in claim 1.

13. The light emitting device according to claim 12, wherein the light-emitting element and the phosphor-containing member are separately arranged from each other.

* * * * *